US005473164A

United States Patent [19]
Klenert et al.

[11] Patent Number: 5,473,164
[45] Date of Patent: Dec. 5, 1995

[54] DEVICE FOR SHIELDING OF X-RAYS IN ELECTRON BOMBARDMENT OF MATERIALS ON A SHEET, ESPECIALLY INK ON A PAPER SHEET

[75] Inventors: Peter Klenert; Klaus Goerner; Wolfram Mueller, all of Leipzig, Germany

[73] Assignee: SID Saechsisches Institut fuer die Druckinductrie GmbH, Engelsdorf, Germany

[21] Appl. No.: 367,692

[22] Filed: Jan. 3, 1995

[51] Int. Cl.$^{6}$ .............................. H01J 37/30; G21F 7/00
[52] U.S. Cl. ...................................... 250/492.3; 250/515.1
[58] Field of Search .............................. 250/492.3, 515.1

[56] References Cited

U.S. PATENT DOCUMENTS

| | | | |
|---|---|---|---|
| 4,252,413 | 2/1981 | Nablo | 250/492.3 |
| 5,120,972 | 6/1992 | Rangwalla et al. | 250/492.3 |
| 5,194,742 | 3/1993 | Avnery et al. | 250/492.3 |

FOREIGN PATENT DOCUMENTS

| | | |
|---|---|---|
| 2919529 | 5/1980 | Germany . |
| 3411752 | 11/1984 | Germany . |

*Primary Examiner*—Jack I. Berman
*Attorney, Agent, or Firm*—Michael J. Striker

[57] ABSTRACT

The device shields from X-radiation produced by electron bombardment of printed inks on a paper sheet in an apparatus including a press device, an electron bombardment device following the press device and a conveying device conveying the paper sheet from the press device through the electron bombardment device to the conveying device. To prevent smearing and double images on the paper sheet the device includes an upstream shielding duct device extending between the press device and the electron bombardment device through which the paper sheet is conveyed; a downstream shielding duct device extending between the electron bombardment device and the downstream conveying device through which the paper sheet is conveyed; a mechanism for contactless transport of the paper sheet from the press device, through the shielding duct devices and the electron bombardment device and to the conveying device; shielding components for shielding from X-radiation provided in press device; and shielding components for shielding against X-radiation provided in the downstream conveying device. Advantageously the upstream and downstream shielding duct devices extend into the press device and the conveying device respectively and the entrance of the upstream shielding duct device is adjacent and close to a contact surface of a press cylinder of the press device.

9 Claims, 1 Drawing Sheet

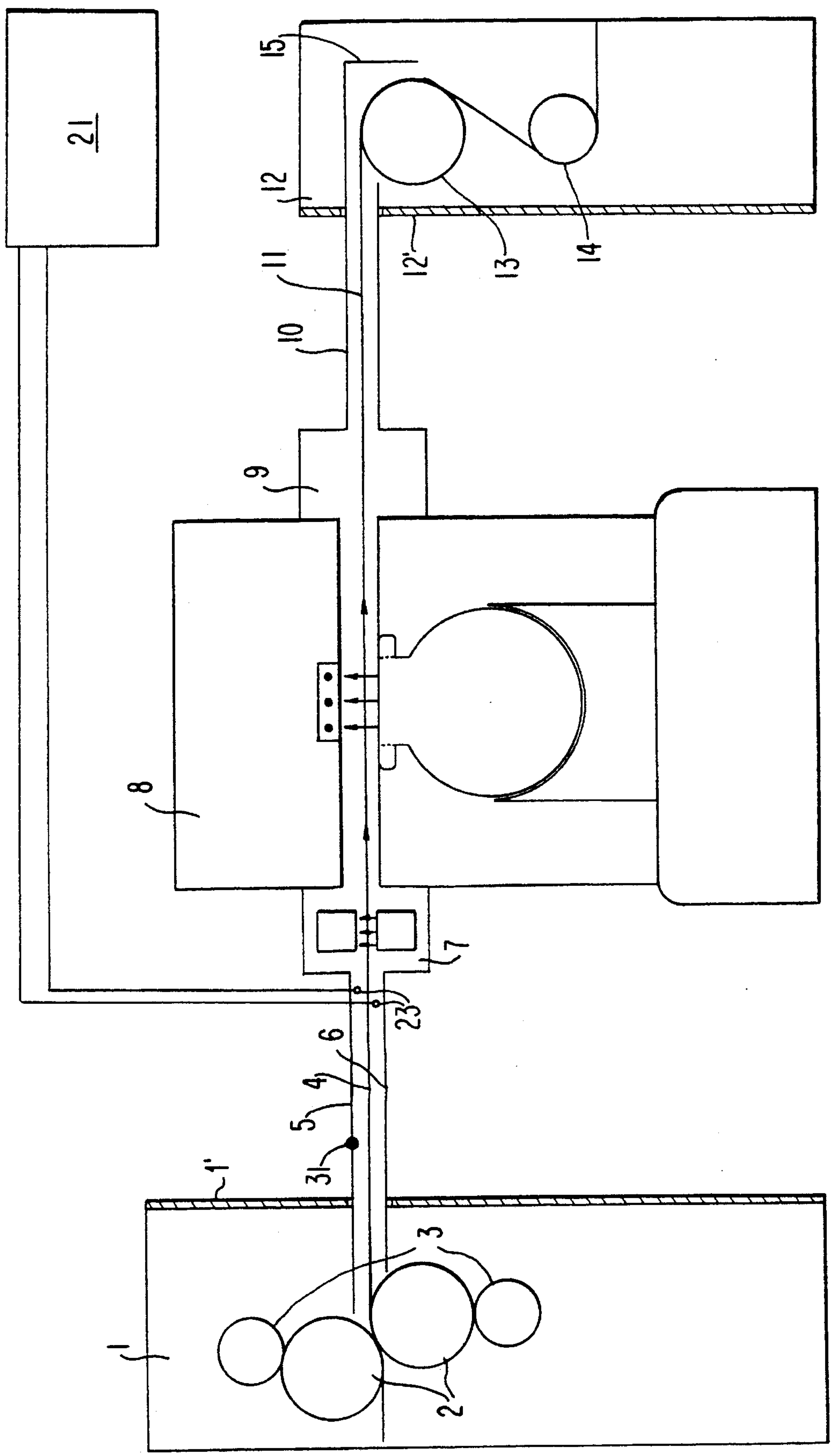
21
15
12
12'
13
14
11
10
9
8
7
23
6
4
5
31
1'
3
1
2

DEVICE FOR SHIELDING OF X-RAYS IN ELECTRON BOMBARDMENT OF MATERIALS ON A SHEET, ESPECIALLY INK ON A PAPER SHEET

BACKGROUND OF THE INVENTION

The present invention relates to a device for shielding of harmful radiation, particularly of X-rays, in electron bombardment or irradiation of materials on a sheet, especially a paper sheet. The device is especially suitable for shielding from radiation formed in electron bombardment hardening of printed inks on a paper sheet.

An apparatus and method for shielding of an inert zone-electron bombardment of materials on a moving sheet is described in German Published Patent Application DE-OS 29 19 529. In this apparatus, among other features, deflection devices are provided to guide the sheets at a predetermined angle to the direction of the inlet collimation and to allow it to issue at a predetermined angle to the direction of the outlet collimation. The escape of the scattered or stray radiation can be avoided because of these deflection devices. The guiding of the sheets is performed for example by rolls or other rotating components.

In the apparatus and method of DE-OS 29 15 529 it is disadvantageous that the smear effect appearing on the surface of the sheet to be dried and double impressions arising because of a a remaining adhering surface layer on the rolls or rotating components leads to a quality reduction in the product.

German Published Patent Application DE-OS 3,411,752 describe means for feeding in and guiding out a sheet-like material each comprising two rotatably mounted driven rolls positioned above each other and contacting each other over their respective lengths. The rolls forming the input and output device each are associated with a moistening means film of a reliable moistening device separating the printed ink on the sheet of material and the roll surface. The drying chamber can be fed a sheet of material freshly printed on blank paper and on the back from any arbitrary direction free of smears with the device described in this reference. However the disadvantages of this feed device are a comparatively large engineering expense because of the required moistening device and rolls.

SUMMARY OF THE INVENTION

It is an object of the present invention to provide a device for shielding materials on a sheet from X-rays in an apparatus of the above-described type, which is comparatively economical, prevents smearing and doubling effects and can be universally used with other drying devices.

According to the invention, the device for shielding from X-radiation produced by electron bombardment of materials on a sheet in an apparatus comprising a processing device, an electron bombardment device following the processing device and a downstream conveying device including means for conveying the sheet with the materials on it from the processing device through the electron bombardment device to the conveying device comprises:

an upstream shielding duct device extending between the processing device and the electron bombardment device, the sheet being conveyed through the upstream shielding duct device by the conveying device;

a downstream shielding duct device extending between the electron bombardment device and the downstream conveying device, the sheet being conveyed through the downstream shielding duct device by the conveying device;

means for contactless transport of the sheet from the processing device, through the upstream shielding duct device, the downstream shielding duct device and the electron bombardment device and to the conveying device;

means for shielding from X-radiation provided in the processing device, the upstream shielding duct device extending into the processing device and having an entrance opening in the processing device; and means for shielding from X-radiation provided in the conveying device, the downstream shielding duct device extending into the conveying device and having an outlet opening in the conveying device.

In a preferred embodiment of the invention the processing device is a press device of a printing press having at least one press cylinder and the entrance opening of the upstream shielding duct device inside the press device is correlated with a contact surface of the at least one press cylinder. Furthermore the upstream shielding duct device can be provided with a deactivating chamber in the vicinity of an entrance of the electron bombardment device through which the sheet passes and the downstream shielding duct device can be also provided with a deactivating chamber in the vicinity of an outlet of the electron bombardment device through which the sheet passes.

In a preferred embodiment of the invention the means for contactless transport of the sheet includes sheet sensors for observing the height of the sheet and means for adjusting the sheet height connected to the sensors and the conveying device.

Advantageously the downstream shielding duct device has a shielding flap inside the conveying device arranged around the conveying roller and spaced from the conveying roller.

Preferably means for folding open the upstream shielding duct means are provided between the processing device and the electron bombardment device.

Advantageously the materials on the sheet consist of printed inks and the electron bombardment apparatus includes means for hardening the printed inks by irradiation with X-rays.

BRIEF DESCRIPTION OF THE DRAWING

The objects, features and advantages of the present invention will now be illustrated in more detail by the following detailed description, reference being made to the accompanying drawing in which:

The sole figure shows a first embodiment of a device for shielding of X-rays in electron bombardment hardening of inks on paper sheets.

DESCRIPTION OF THE PREFERRED EMBODIMENT

FIG. 1 shows a first embodiment of the device according to the invention. A final stage press device 1 of a roller offset printing press, in which first and second press cylinders 2 are arranged vertically above, but laterally displaced from, each other, is shown in the figure. The press cylinders 2 are arranged with a sheet of paper 4 between them and they are opposite and close to an upstream shielding duct device 5,6 (including upper upstream shield member 5 and its lower upstream shield member 6) which extends into the press device 1 and acts to shield them from the stray X-radiation entering the upstream shielding duct device 5,6 from an electron bombardment device or drier 8.

X-radiation eventually escaping through a gap between the upper upstream shield member 5 and the adjacent press roller 3 and between the lower upstream shield member 6 and its adjacent press roller 3 is shielded by the housing of the press device 1. For example, the wall 1' of the housing of the press device 1 can act as a shielding element, e.g. if reinforced by a lead coating. Also if a press shut down occurs, e.g. because of a tear in the paper sheet, adequate shielding preventing emission of X-radiation from the press device is thereby guaranteed, although a gap is present between the first press cylinder 2 and the second press cylinder 2 because of the absence of the paper sheet.

The upper and lower shield members 5 and 6 and 10 and 11 are provided with lead coated surfaces to shield against X-radiation entering the upstream shielding duct device 5, 6 and a downstream shielding duct device 10, 11 provided between the electron bombardment device 8 and the conveying device 12.

The upper upstream shield member 5 and the upper downstream shield member 10 of the shielding duct devices are removable so that a manual feed and input of the paper sheet is possible. Furthermore the upper upstream shield member 5 of the upstream shielding device 5,6 between the press device 1 and the electron bombardment drier or device 8 can be pivoted open by operation a pivoting device including hinge device 31 and thereby provides space, as needed, for additional drying devices, for example unillustrated Infrared or UV-drying devices.

Access for work on the press device 1 is also increased by these pivoting devices 31. An inert gas is blown into the space above and below the sheet 4 of paper in the deactivating chambers 7 and 9 at the entrance and outlet of the electron bombardment device or drier 8.

Downstream shielding duct device 10,11 including the removable upper downstream shield member 10 and lower downstream shield member 11 shield the paper sheet 4 from the outlet of the electron bombardment device 8 until at the sheet conveying device 12. The upper downstream shield member 10 is formed so that it extends over a first conveying roller 13. A movable shield flap 15 is attached to the downstream end of the upper downstream shield member 10 downstream of the first conveying roller 13. A minimal spacing or gap between the first conveying roller 13 and the downstream shielding duct device can be provided by adjustment of the adjustable shield flap 15. The conveying roller 13 in the conveying device 12 is part of the shield device because of the guiding of the scattered or stray radiation by means of the shielding duct device. Besides this shielding function it provides together with the second conveying roller 14 the necessary sheet tensions to cause a contactless conveyance of the paper sheet 4 through the upstream and downstream shielding duct devices and the electron bombardment device 8.

Two sensors 23 are arranged in the shielding duct devices for detection of the height of the paper sheet 4 in the shielding duct devices. In this embodiment they are provided in the upstream shielding duct device 5,6. These sensors 23 are connected to means for controlling the tension on the paper sheet 4 which can be a motor controller 21 for driving the conveying roller 13. Thus the height of the paper sheet 4 is maintained within a predetermined height range by means of these sensors 23. When the paper sheet 4 reaches a height outside of this predetermined height range the press machine is automatically shut off by a shut off means provided for that and connected to the sensors.

A wall 12' can be provided in the conveying device 12 as a further element for shielding against radiation.

By "contactless transport" the suspension of the sheet without touching or otherwise contacting the walls, entrance and outlet mouth edges and/or the components of the devices is meant.

While the invention has been illustrated and described as embodied in a device for shielding of X-rays in electron bombardment of sheets of various material, particularly paper sheets having printed inks thereon, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. Device for shielding from X-radiation produced by electron bombardment of materials on a sheet in an apparatus comprising a processing device, an electron bombardment device following the processing device and a downstream conveying device including means for conveying the sheet with the materials from the processing device through the electron bombardment device to the conveying device; said device for shielding from X-radiation comprising:

an upstream shielding duct device extending between the processing device and the electron bombardment device, said sheet being conveyed through said upstream shielding duct device by said conveying device;

a downstream shielding duct device extending between the electron bombardment device and the downstream conveying device, said sheet being conveyed through said downstream shielding duct device by said conveying device;

means for contactless transport of said sheet from said processing device, through said upstream shielding duct device, d said downstream shielding duct device and said electron bombardment device and to said conveying device;

means for shielding from X-radiation provided in said processing device, said upstream shielding duct device extending into the processing device and having an entrance opening in the processing device; and means for shielding from X-radiation provided in said conveying device, said downstream shielding duct device extending into the conveying device and having an outlet opening in the conveying device.

2. Device as defined in claim 1, wherein the processing device is a press device having at least one press cylinder and the entrance opening of the upstream shielding duct device is arranged inside said press device adjacent to a contact surface of said at least one press cylinder.

3. Device as defined in claim 1, wherein said upstream shielding duct device is provided with a deactivating chamber in the vicinity of an entrance of said electron bombardment device through which said sheet passes.

4. Device as defined in claim 1, wherein said downstream shielding duct device is provided with a deactivating chamber in the vicinity of an outlet of said electron bombardment device through which said sheet passes.

5. Device as defined in claim 1, further comprising sheet sensors for observation of a height of said sheet, said sheet sensors being located in said upstream shielding duct device between the processing device and the electron bombardment device.

6. Device as defined in claim 5, wherein said sheet sensors are part of said means for contactless transport of said sheet.

7. Device as defined in claim 1, wherein the downstream shielding duct device has a shielding flap inside said conveying device arranged around said conveying roller and spaced from said conveying roller.

8. Device as defined in claim 1, further comprising means for opening said upstream shielding duct device located between the processing device and the electron bombardment device for access to said paper sheet.

9. Device as defined in claim 1, wherein said materials on said sheet consist of printed inks and said electron bombardment apparatus includes means for hardening said printed inks.

* * * * *